United States Patent [19]

Hays

[11] Patent Number: 5,437,739
[45] Date of Patent: Aug. 1, 1995

[54] ETCH CONTROL SEAL FOR DISSOLVED WAFER MICROMACHINING PROCESS

[75] Inventor: Kenneth M. Hays, Anaheim, Calif.

[73] Assignee: Rockwell International Corporation, Seal Beach, Calif.

[21] Appl. No.: 229,501

[22] Filed: Apr. 19, 1994

[51] Int. Cl.$^6$ .......................................... H01L 21/302
[52] U.S. Cl. ................... 148/33.3; 437/974; 216/2; 216/34
[58] Field of Search ....................... 148/33.3, DIG. 12; 437/974; 156/631, 632, 633

[56] References Cited

U.S. PATENT DOCUMENTS 4,465,549 8/1984 Ritzman ............................. 156/633
4,523,964 6/1985 Wilner et al. ...................... 148/33.3

FOREIGN PATENT DOCUMENTS 5226483 9/1993 Japan .................... 437/974

OTHER PUBLICATIONS

Bernstein et al., "A Micromachined Comb-Drive Tuning Fork Rate Gyroscope," *IEEE Proceedings on Micro Electro Mechanical Systems*, pp. 143-148, Feb. 7, 1993.

Primary Examiner—George Fourson
Assistant Examiner—Thomas G. Bilodeau
Attorney, Agent, or Firm—John C. McFarren

[57] ABSTRACT

A dissolved wafer micromachining process is modified by providing an etch control seal around the perimeter of a heavily doped micromechanical structure formed on a substrate. The micromechanical structure is fabricated on a wafer using conventional methods including the formation of a trench that surrounds and defines the shape of the micromechanical structure in the substrate. The etch control seal comprises a portion of the substrate in the form of a raised ring extending around the perimeter of the micromechanical structure and its defining trench. Selected raised areas of the heavily doped micromechanical structure and the top of the raised etch control seal are bonded to a second substrate. A selective etch is then used to dissolve the first substrate so that the heavily doped micromechanical structure remains attached to the second substrate only at the bonded areas. The etch control seal reduces exposure of the micromechanical structure and bonded areas to the etch by preventing the etch from contacting the heavily doped structure until the etch leaks through the dissolving floor of the trench. This occurs only during the final stages of the substrate dissolution step, thus minimizing exposure of the micromechanical structure and bonded areas to the damaging effects of the etch. Use of an etch control seal increases design flexibility and improves micromechanical device yield and quality in a dissolved wafer fabrication process.

14 Claims, 2 Drawing Sheets

ETCH CONTROL SEAL FOR DISSOLVED WAFER MICROMACHINING PROCESS

TECHNICAL FIELD

The present invention relates to dissolved wafer micromachining processes and, in particular, to a dissolved wafer process using a perimeter seal to limit exposure of micromechanical structures to the dissolving etch.

BACKGROUND OF THE INVENTION

FIGS. 1-3 illustrate a conventional dissolved wafer process for fabricating microelectromechanical devices and systems on a substrate 10. As shown in FIG. 1, an intricately patterned, heavily doped micromechanical structure 12, which comprises a simplified micromechanical resonator as an example, is formed on a substrate 10 comprising silicon, germanium, gallium arsenide, or other microscopically machinable material. Micromechanical structure 12 may be formed using conventional masking, etching, diffusion, ion implantation, and epitaxial growth techniques. In one technique, the top surface 11 of substrate 10 is heavily doped with a selected dopant to a desired depth, as best illustrated in FIG. 2. The shape of structure 12 can then be defined by trenches 14 in substrate 10 using reactive ion etching, wet chemical etching, or other conventional techniques. Trenches 14 penetrate substrate 10 to below the depth of heavy doping and surround the region forming heavily doped structure 12. Selected raised areas 16 of heavily doped structure 12 are formed by reactive ion etching, wet chemical etching, or other conventional etching or patterned layer deposition techniques that may be performed prior or subsequent to the steps used to form structure 12. Raised areas 16 are subsequently bonded to a second substrate 18, as shown in FIG. 2. FIG. 2 is a cross section of substrate 10 taken along the section lines 2—2 of FIG. 1, with the addition of second substrate 18 bonded atop substrate 10 at raised areas 16. Substrate 18 may comprise any material or combination of materials that can be bonded to raised areas 16 and that resist the selective etch used to dissolve substrate 10. The bonding operation can be accomplished using any conventional technique or combination of techniques such as anodic bonding, optical contacting, thermal bonding, pressure bonding, or soldering, for example. After substrate 18 is bonded to raised areas 16, substrate 10 is dissolved in a selective etch, such as hydrazine or ethylenediamine pyrocatechol (EDP) for silicon substrates, for example. The doped regions 12 and 16, which form the resonator, resist dissolving in the selective etch. After first substrate 10 has dissolved down to trenches 14, micro-mechanical structure 12 is released from first substrate 10 but it remains bonded to second substrate 18 at raised areas 16, as shown in FIG. 3. This allows structure 12 to function as a microelectromechanical resonator. Heavily doped areas 11 of substrate 10 that are not bonded to substrate 18 simply fall away from structure 12 after substrate 10 has dissolved.

Because heavily doped micromechanical structure 12 is bonded to second substrate 18 only at selected areas 16 and is surrounded by a gap between the two substrates, micromechanical structure 12 and the surfaces of substrate 18 to which it is bonded are exposed to the selective etch for the duration of its application to dissolve first substrate 10. Although the heavily doped material of structure 12 and the material of substrate 18 resist the selective etch, they are nevertheless attacked by the etch to some degree. This undesirable effect limits design flexibility of micromechanical structures and leads to poor device yield. Therefore, improved techniques are needed to increase design flexibility and improve the yield of micromechanical devices fabricated by dissolved wafer processes.

SUMMARY OF THE INVENTION

An embodiment of the present invention modifies a dissolved wafer micromachining process by providing an etch control seal around the perimeter of a heavily doped micromechanical structure formed on the wafer. The micromechanical structure is fabricated on the wafer using conventional methods, as described above, including the formation of a trench that surrounds and defines the shape of the micromechanical structure in the substrate. The etch control seal comprises a portion of the substrate in the form of a raised ring extending around the perimeter of the micromechanical structure and its defining trench. Selected raised areas of the heavily doped micromechanical structure and the top of the raised etch control seal are bonded to a second substrate. A selective etch is then used to dissolve the first substrate so that the heavily doped micromechanical structure remains attached to the second substrate only at the bonded areas. The etch control seal reduces exposure of the heavily doped micromechanical structure to the etch by preventing the etch from contacting the heavily doped structure until the etch leaks through the dissolving floor of the trench. This occurs only during the final stages of the substrate dissolution step, thus minimizing exposure of the micromechanical structure to the damaging effects of the etch.

A principal object of the invention is fabrication of high quality micromechanical structures. A feature of the invention is an etch control seal that reduces exposure of micromechanical structures to the selective etch in a dissolved wafer process. An advantage of the invention is increased design flexibility and improved micromechanical device yield and quality in a dissolved wafer process.

BRIEF DESCRIPTION OF THE DRAWINGS

For a more complete understanding of the present invention and for further advantages thereof, the following Detailed Description of the Preferred Embodiments makes reference to the accompanying Drawings, wherein like reference numerals indicate the same or similar elements throughout the various Figures, in which.

DETAILED DESCRIPTION OF THE PREFERRED EMBODIMENTS

Figure 1:
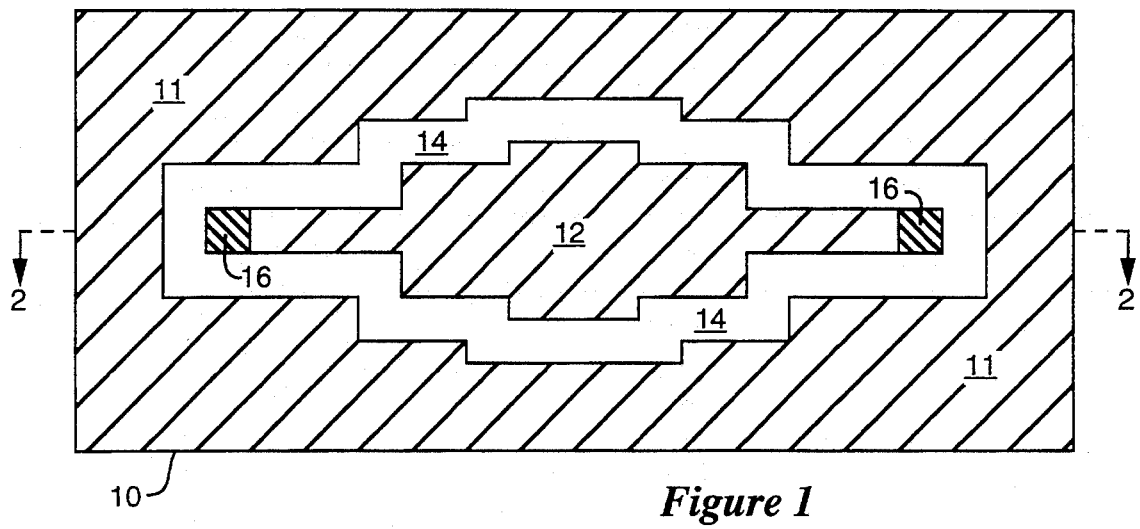
FIG. 1 is a top plan view of a prior art micromechanical structure formed on a substrate.
Figure 2:
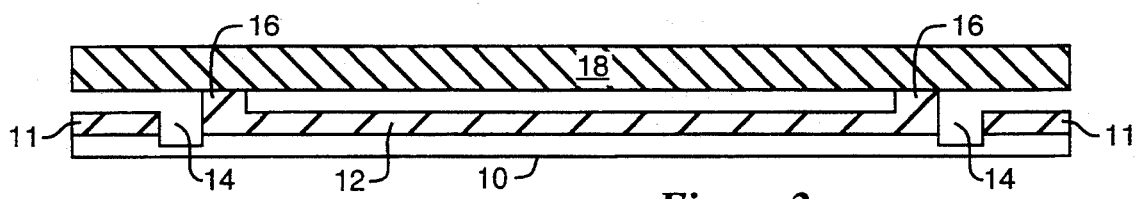
FIG. 2 is a cross-sectional view of the prior art substrate and micromechanical structure of FIG. 1 bonded to a second substrate.
Figure 3:
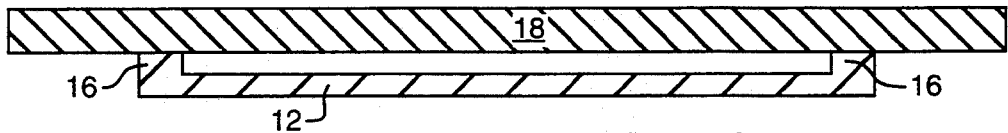
FIG. 3 is a cross-sectional view of the micromechanical structure of FIG. 2 after dissolution of the first substrate.
Figure 4:
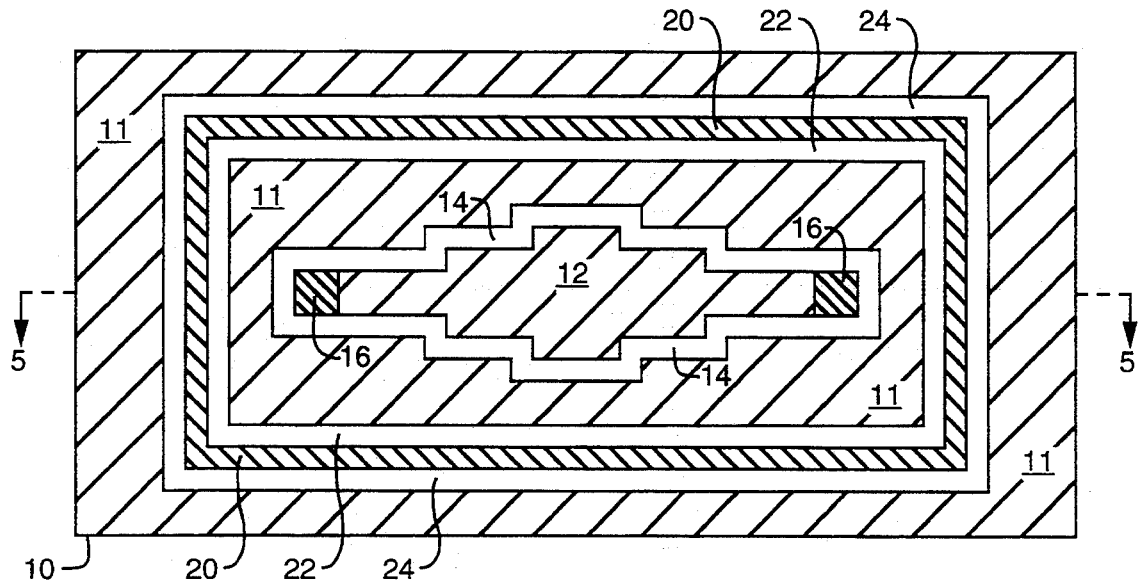
FIG. 4 is a top plan view of a micromechanical structure and etch control seal of the present invention formed on a substrate.
Figure 5:
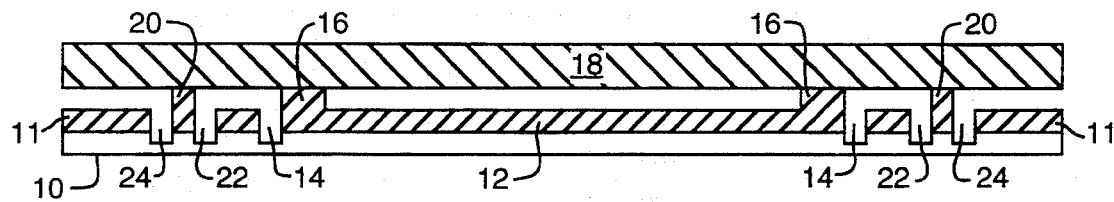
FIG. 5 is a cross-sectional view of the micromechanical structure and etch control seal of FIG. 4 bonded to a second substrate.
Figure 6:
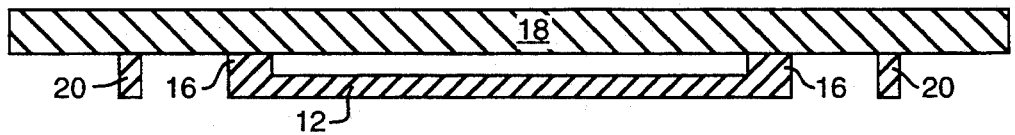
FIG. 6 is a cross-sectional view of the micromechanical structure of FIG. 5 after dissolution of the first substrate.

Substrate 10 and micromechanical structure 12, described above in conjunction with FIGS. 1-3, are illustrated in FIGS. 4-6 in combination with one embodiment of an etch control seal 20 of the present invention. As shown in FIG. 4, etch control seal 20, which is surrounded on both sides by trenches 22 and 24, respectively, extends around the entire perimeter of microstructure 12 and its defining trench 14. Seal 20 and trenches 22 and 24 can be formed using the same patterning steps used to form micromechanical structure 12 and its defining trench 14. In some embodiments trenches 14 and 22 can form a single trench etched in substrate 10 between microstructure 12 and seal 20, and trench 24 may comprise a trench, similar to trench 22 or 14, for a neighboring microstructure on substrate 10 sharing a common wall of seal 20. Seal 20 typically comprises the same heavily doped material as in microstructure 12 and raised areas 16 that resists the effects of the wafer dissolving selective etch. In alternative embodiments, seal 20 may comprise other etch resistant materials that are compatible with substrates 10 and 18 and the bonding process. As best shown in cross section in FIG. 5, seal 20 comprises a flat ring raised above the remainder of heavily doped surface 11 of substrate 10 to the same extent as raised areas 16 of microstructure 12. Before dissolution of substrate 10, second substrate 18 is bonded to raised areas 16 of microstructure 12 and to the top of etch control seal 20 around the entire perimeter of structure 12, as shown in the cross section of FIG. 5.

The bonded assembly illustrated in FIG. 5 is then exposed to a selective etch as described above in conjunction with FIG. 2. When compared with the assembly of FIG. 2, it can be seen that seal 20 in FIG. 5 prevents the dissolving etch from entering the gap between micromechanical structure 12 and substrate 18 (and around bonded raised areas 16) until the final stages of the dissolution of substrate 10. The selective etch only comes into contact with microstructure 12 and areas 16 when the etch leaks through the dissolving floors of trenches 14 and 22. This occurs only during the last stages of the dissolution of substrate 10 so that microstructure 12 and bonded areas 16 receive minimal exposure to the damaging effects of the dissolving etch. Seal ring 20 also prevents the flowing of etch fluids between the bonded pair of substrates 10 and 18 during dissolution of substrate 10. Dissolving substrate 10 becomes very thin and flexible during the final minutes of dissolution, and etch fluids flowing between the substrates can tear apart the wafers and the bonded micromechanical structures 12.

As an alternative to (or in addition to) surrounding each micromechanical device with an etch control ring 20 as shown in FIGS. 4-6, ring 20 may be constructed around a group or cluster of devices, and several rings may share common walls, as in an ice tray. To minimize the wafer surface area used by etch control seals, a seal ring may be constructed around the entire perimeter of the wafer surface. Seal rings can also be placed along wafer saw streets to reduce or eliminate the need to use scarce device surface area for seal rings.

In addition to protecting micromechanical devices from attack by the selective etch during dissolution of the first substrate, seal rings also increase the total surface area bonded to the second substrate. This makes a bonded pair of substrates a much stronger assembly. Handling, storage, and processing characteristics of the bonded assembly, particularly during fabrication steps performed between the time the substrates are joined and the time the first substrate is completely dissolved, are thus improved. This is an important advantage for typical micromechanical designs that have bond joints with small surface areas.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. An etch control seal for a micromachining process, comprising:
   a first substrate dissolvable in a selective etch;
   a micromechanical structure having raised areas formed on said first substrate;
   a raised region of said first substrate forming a raised ring around said micromechanical structure, said raised ring having greater resistance to said selective etch than said first substrate; and
   a second substrate bonded to said raised ring and said raised areas of said micromechanical structure, said second substrate having greater resistance to said selective etch than said first substrate, said bonded ring forming an etch control seal for protecting said micromechanical structure from said selective etch during a process of dissolving said first substrate in said selective etch.

2. The etch control seal of claim 1, wherein said micromechanical structure and said raised ring comprise a doped layer of said first substrate having greater resistance to said selective etch than the rest of said first substrate.

3. The etch control seal of claim 2, wherein said micromechanical structure is defined by a trench surrounding said structure and extending into said substrate below said doped layer.

4. The etch control seal of claim 3, wherein said raised ring is defined by trenches on both sides of said ring, said trenches extending into said substrate below said doped layer.

5. The etch control seal of claim 1, wherein said raised ring comprises material deposited atop said first substrate, said deposited material having greater resistance to said selective etch than said first substrate.

6. The etch control seal of claim 1, wherein said structure and bonding ring are formed from a top layer of said first substrate having greater resistance to said selective etch than the rest of said first substrate.

7. The etch control seal of claim 6, wherein said structure is defined by a trench surrounding said structure and extending into said first substrate below said top layer.

8. The etch control seal of claim 6, wherein said bonding ring is defined by a trench in said first substrate between said structure and said bonding ring, said trench extending into said first substrate below said top layer.

9. The etch control seal of claim 8, wherein said bonding ring is further defined by a second trench in said first substrate surrounding both said structure and said bonding ring, said second trench extending into said first substrate below said top layer.

10. A bonded assembly for a micromachining process, comprising:
- a first substrate comprising a material that dissolves in a selective etch;
- a structure formed atop said first substrate, said structure including raised bonding areas;
- a raised bonding ring formed atop said first substrate and surrounding said structure, said bonding ring having greater resistance to said selective etch than said first substrate; and
- a second substrate bonded to said raised bonding ring and said raised areas of said structure, said second substrate having greater resistance to said selective etch than said first substrate, said bonded ring forming an etch control seal for protecting said structure from said selective etch during a process of dissolving said first substrate in said selective etch.

11. The bonded assembly of claim 10, wherein said structure formed atop said first substrate comprises material having greater resistance to said selective etch than said first substrate.

12. The bonded assembly of claim 11, wherein said structure and said bonding ring are defined by at least one trench between said structure and said bonding ring, said at least one trench extending into said first substrate material that dissolves in said selective etch.

13. The bonded assembly of claim 12, wherein said bonding ring is further defined by an additional trench surrounding said bonding ring, said additional trench extending into said first substrate material that dissolves in said selective etch.

14. The bonded assembly of claim 13, wherein said structure and said bonding ring are formed from a layer atop said first substrate having greater resistance to said selective etch than the rest of said first substrate.

* * * * *